United States Patent
Preil

(10) Patent No.: US 6,868,301 B1
(45) Date of Patent: Mar. 15, 2005

(54) METHOD AND APPLICATION OF METROLOGY AND PROCESS DIAGNOSTIC INFORMATION FOR IMPROVED OVERLAY CONTROL

(75) Inventor: Moshe E. Preil, Sunnyvale, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 177 days.

(21) Appl. No.: 10/364,769

(22) Filed: Feb. 11, 2003

(51) Int. Cl.$^7$ .............................................. G06F 19/00
(52) U.S. Cl. ...................... 700/121; 700/109; 438/14; 716/19
(58) Field of Search ................ 700/121, 110, 700/109; 716/19, 21; 438/14; 430/22, 30

(56) References Cited

U.S. PATENT DOCUMENTS

| | | | |
|---|---|---|---|
| 6,708,075 B2 * | 3/2004 | Sonderman et al. | 700/121 |
| 6,756,243 B2 * | 6/2004 | Pasadyn et al. | 438/14 |
| 6,788,988 B1 * | 9/2004 | Pasadyn et al. | 700/110 |

OTHER PUBLICATIONS

Levinson et al. "Minimization of Total Overlay Errors on Product Wafers Using an Advanced Optimization Scheme" SPIE vol. 3051, published 1997, pp. 362–373.*

* cited by examiner

*Primary Examiner*—Leo Picard
*Assistant Examiner*—Steven R. Garland
(74) *Attorney, Agent, or Firm*—Luedeka, Neely & Graham, P.C.

(57) ABSTRACT

A method for operation of an exposure tool in the fabrication of an integrated circuit to control registration between a preceding layer of and a succeeding layer. The preceding layer having a first alignment mark and a first registration mark. The succeeding layer is aligned to the preceding layer using an exposure tool. The succeeding layer has a second alignment mark and a second registration mark. The exposure tool measures alignment of the first alignment mark relative to the second alignment mark. After additional process steps are performed, a measurement tool measures registration relating to relative positions of the first registration mark and the second registration mark. Both the alignment information from the exposure tool and the registration information from the measurement tool is analyzed to determine corrections to improve registration between the layers, and the operation of the exposure tool is altered to improve registration.

31 Claims, 2 Drawing Sheets

METHOD AND APPLICATION OF METROLOGY AND PROCESS DIAGNOSTIC INFORMATION FOR IMPROVED OVERLAY CONTROL

FIELD

This invention relates to the field of process control. More particularly, this invention relates to control of mask layer alignment for integrated circuits, and analysis and reduction of alignment error to improve production yield.

BACKGROUND

Integrated circuits are typically fabricated using photolithographic processes that employ a photo mask and an associated exposure tool to transfer a circuit image or other such pattern onto a substrate, such as a silicon wafer coated with photoresist. The completed integrated circuit includes many such patterned layers, and the quality of the resulting integrated circuit is highly dependent upon precise alignment of the layers, one to another. Thus, it is very important to ensure that the alignment processes are well characterized, capable, and in control.

The degree to which one layer is properly registered to another layer is typically measured by inspecting the spatial relationship between two features, commonly called registration marks, one of which resides on a first of the two layers, and a second of which resides on a second of the two layers. Typically, the two marks are considered to be a single registration mark when combined. However, for the sake of readily referring to the separate parts of the registration mark, they are designated as separate marks herein.

The linear distances between one or more given elements of the two features are measured and compared to an ideal. The ideal is typically measured by how well one mark is centered in regard to the other mark, such as is depicted in FIGS. 1A–1D. The greater the discrepancy between the measured linear distances and the ideal, the poorer the alignment between the two layers. Information relating to the measured accuracy or inaccuracy of the alignment marks is used to make corrections to the fabrication process to improve the overlay accuracy between the two layers.

Alignment inaccuracies can arise from various sources during the alignment process. These sources include imperfections in the exposure tool, distortion of the alignment marks during subsequent processing of the substrate, and interactions between the exposure tool and distorted marks. Similar inaccuracies can arise during the measurement process. For example, measurement inaccuracies can result from imperfections in the measurement tool, distortion of the registration marks, and interactions between the measurement tool and the registration marks.

Such measurements of the alignment marks and of the registration marks of different layers are typically made at two different times during a photolithographic fabrication cycle. First, an alignment measurement is typically made by the exposure tool which exposes the images onto the substrates, as it aligns a succeeding mask layer to a preceding mask layer. In making such an alignment, the exposure tool adjusts the registration of the image to the substrate, until its sensors indicate that the registration, or in other words the alignment, of the image to the substrate is perfect, or at least within a predetermined maximal error, at which point the exposure tool exposes the image onto the substrate.

The second measurement is typically conducted after a few intervening process steps have been performed, such as developing and hard baking the photoresist on the substrate. At this point, a measurement tool is typically employed to measure the offsets between sets of registration marks, being either the same marks used by the exposure tool to determine alignment, or other features on the patterned surface of the substrate. The measurement tool also reports a value, which may or may not be equal to the ideal offset, and which further may or may not be equal to the offset reported by the exposure tool.

Thus, each of the two different instruments used to measure the offsets between the two layers makes the implicit assumption that it has provided an absolutely correct set of results. However, the two sets of results may not agree, thus raising the understanding that one of the sets of results, and possibly both sets of results, are inaccurate. The question then exists, which data set is used to determine whether the alignment and exposure has been properly made, and how should the data be used, if at all, to adjust the exposure tool for future exposures. In other words, which instrument is to be believed, and what is to be done with the data.

The invention advantageously achieves improved correction of alignment inaccuracies by taking into account inaccuracies associated with both the exposure tool and the measurement tool.

SUMMARY

The above and other needs are met by a method for controlling the operation of an exposure tool in the fabrication of an integrated circuit on a substrate, so as to control registration between a preceding layer of the integrated circuit and a succeeding layer of the integrated circuit. The preceding layer is formed having an associated first alignment mark and an associated first registration mark. The succeeding layer is aligned to the preceding layer using an exposure tool. The succeeding layer has an associated second alignment mark and an associated second registration mark. The exposure tool measures and reports alignment information relating to relative positions of the first alignment mark associated with the preceding layer and the second alignment mark associated with the succeeding layer. Additional process steps are performed on the substrate. After the additional process steps are performed, a measurement tool measures and reports registration information relating to relative positions of the first registration mark associated with the preceding layer and the second registration mark associated with the succeeding layer. Both the alignment information from the exposure tool and the registration information from the measurement tool is analyzed to determine corrections to improve registration between the preceding layer and the succeeding layer, and the operation of the exposure tool is altered based at least in part upon the determined corrections.

In this manner, the methods described herein provide numerous advantages relating to the fabrication of integrated circuits. The methods enable higher confidence in the accuracy of the registration between layers. The methods help the user resolve discrepancies between the data provided by the exposure tool and the measurement tool, and help determine what is the true overlay performance of the system. This higher confidence and better determination of the true overlay performance enables more accurate calculation of exposure tool correctables, leading to tighter overlay control, leading to higher yield of integrated circuits, and enabling process shrinks to squeeze more good die onto each substrate, resulting in a significant reduction in cost per die.

In various preferred embodiments, the exposure tool is selected from a group consisting of scanners, steppers, step and scan systems, proximity printing systems, and contact printers. The measurement tool is preferably selected from a group consisting of scanning electron microscopes, optical microscopes, non-imaging optical tools such as scatterometers, tools using diffraction gratings to create a phase signal, and physical metrology profilometers such as atomic force microscopes and high resolution profilometers. The alignment information preferably includes raw measurement data, and most preferably includes both raw measurement data and data quality metrics. Likewise, the registration information preferably includes raw measurement data, and most preferably includes both raw measurement data and data quality metrics. The data quality metrics are preferably selected from a group consisting of metrics of signal strength, metrics of signal symmetry, metrics of how well a signal reproduces an expected indicia, and analysis of the indicia to determine spatial frequencies and material composition of the indicia.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

The invention relates to methods for achieving improved overlay control and correction of alignment inaccuracies in the manufacture of integrated circuits by taking into account inaccuracies associated with both the exposure tool and the measurement tool. The overlay or mis-registration between layers of an integrated circuit relates to the lateral displacement between the layers of the integrated circuit from their desired, perfect alignment. The purpose of overlay control is to minimize errors in registration between subsequent masking layers.

Figure 1A:
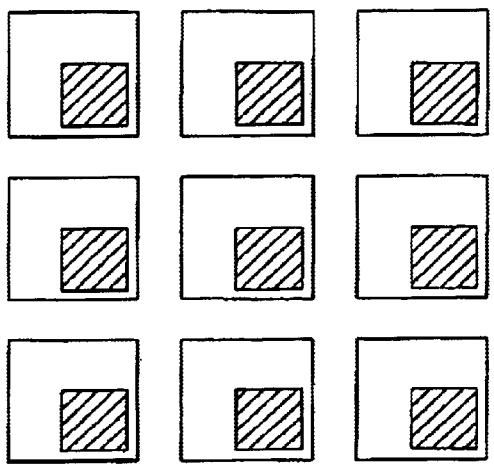
FIGS. 1A–1D depict examples of overlay errors that occur during manufacture of integrated circuits.
Figure 1B:
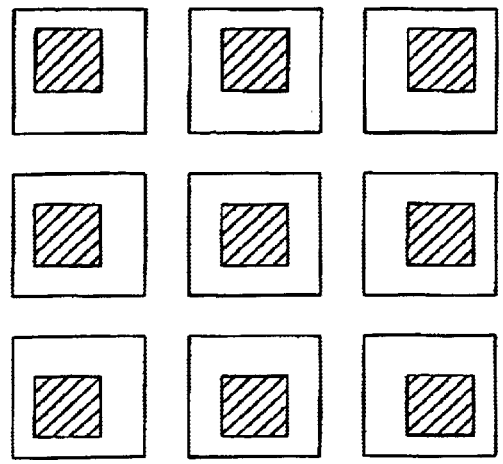
Figure 1C:
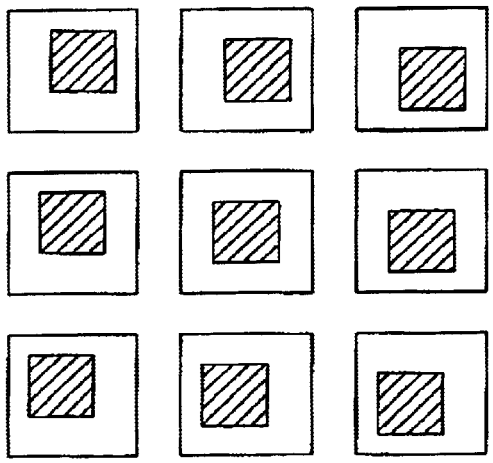
Figure 1D:
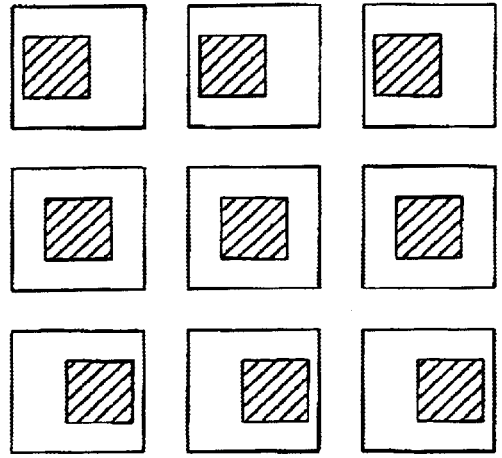

There are many types of overlay errors that occur during manufacturing. Some of these errors include translation, rotation, magnification, and shear. Examples of these overlay errors are shown in FIGS. 1A–1D. For example, FIG. 1A depicts grid translation, FIG. 1B depicts grid magnification, FIG. 1C depicts grid rotation, and FIG. 1D depicts grid shear.

Figure 2:
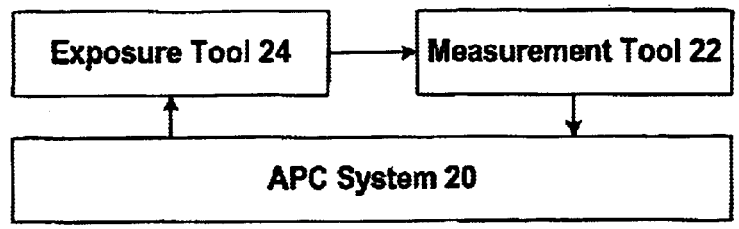
FIG. 2 is a flow chart for a conventional feedback system for overlay control.

Overlay errors have conventionally been controlled by providing a feedback loop is between an external measurement tool and the exposure tool through an advanced process control system (APC System), as depicted in FIG. 2. The APC System 20 monitors overlay errors at each masking operation to detect slow drifts or sudden shifts. When a disturbance in overlay is detected by the APC System 20, software associated with the APC System updates the alignment parameters on the exposure tool 24. FIG. 2 illustrates a typical feedback system for overlay control wherein an APC System 20 utilizes information obtained from a measurement tool 22 to modify the operation of the exposure tool 24. Feedback systems such as the system of FIG. 2 conventionally utilize only raw data obtained from the measurement tool 22, and typically that raw data is implicitly assumed to be absolutely correct and infallible. The present invention uses information from both the measurement tool and the exposure tool to achieve improved overlay control, and most preferably also uses raw data and additional information from one or both of the tools.

As used herein, the term "exposure tool" refers to exposure tools common to photolithography processes used to pattern integrated circuits and including, but not limited to, scanners, steppers, step and scan systems, proximity printing systems, contact printers, and the like using visible, ultraviolet, deep ultraviolet, extreme ultraviolet, electron beam, and X-ray exposure systems. The exposure tool typically includes an associated alignment system or positioning of the exposure tool relative to registration patterns or targets.

As used herein, the term "measurement tool" refers to off-line metrology tools commonly used to measure the registration of patterns, targets, and the like formed on an integrated circuit substrate and includes, but is not limited to, scanning electron microscopes, optical microscopes, non-imaging optical tools such as scatterometers, tools using diffraction gratings to create a phase signal, and physical metrology profilometers such as atomic force microscopes and high resolution profilometers.

In accordance with a preferred embodiment, quantification of registration of patterns or targets involves comparison of measurement standards or metrics of target diagnostics associated with the measurement tool with measurement standards or metrics of target diagnostics associated with the alignment system of the exposure tool. For example, the metrics of target diagnostics associated with the measurement tool may include 1) metrics of signal strength, 2) metrics of signal symmetry, 3) metrics of how well the signal reproduces an expected target (e.g., such as a pattern or template), 4) analysis of the targets, as by spectral or Fourier analysis, to determine spatial frequencies and/or material composition of the targets, and (6) combinations of the foregoing. The metrics associated with the alignment system target diagnostics are similar, but are applied to the alignment signal associated with the alignment system of the exposure tool.

The metrics of the quality of the alignment signals seen by the exposure tool and the metrics of the quality of the metrology signals seen by the measurement tool are used, preferably in conjunction with raw data from the exposure tool and the measurement tool, to yield correctable parameters associated with the operation of the exposure tool. These "correctables" are then implemented in the manufacturing process. In one aspect, the metrics of the quality of the signals are used to modify control programs associated with the exposure tool, such as alignment, measurement, and analysis programs, to yield corrections in the manufacturing process which achieve enhanced overlay performance on the substrate and improve the quality of the produced integrated circuits.

For example, the combination of data from the exposure tool and the measurement tool may be used to 1) compute improved exposure tool correctables to more accurately reflect the true overlay performance, 2) modify the measurement tool data collection scheme to yield more accurate data, 3) modify the exposure tool alignment plan to perform more accurate alignments, and 4) correlate the results of both the alignment and measurement tools with substrate yield data to compute improved correctables that achieve improved quality.

Figure 3:
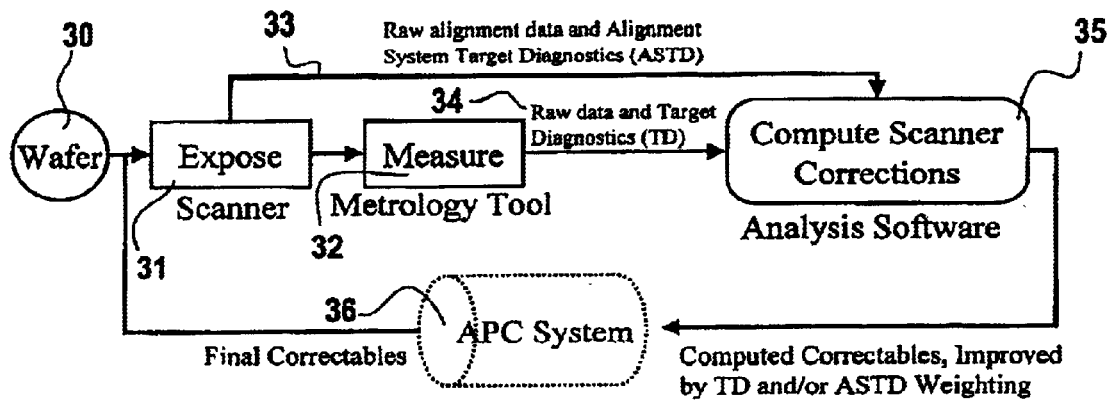
FIG. 3 is a flow chart for a feedback system for overlay control in accordance with a first preferred embodiment of the invention.

Referring now to FIG. 3 there is shown a flow chart of a feedback system in accordance with a preferred embodiment of the invention for achieving improved correction of alignment inaccuracies by taking into account inaccuracies associated with data measurement by both the exposure tool and the measurement tool.

As shown in FIG. 3, a substrate or wafer having a preceding layer already formed is presented in Step 30, and then is aligned and exposed with a succeeding layer image using an exposure tool as given in Step 31. As a part of this process step, the exposure tool measures and collects offset measurement data in regard to the alignment which it performs, which is referred to as alignment information herein. Preferably, the exposure tool also collects metrics in regard to the quality of the measurement data that it has generated, which is also preferably a part of the alignment information.

As given in Step 32, registration information from the exposed and further processed substrate is obtained by an external measurement tool. The measurement tool preferably also collects metrics in regard to the quality of the registration information that it has generated. As indicated by the line designated 33, and in accordance with a preferred embodiment of the invention, raw alignment data from the alignment system of the exposure tool and the metrics of data quality associated with the alignment system of the exposure tool (called alignment system target diagnostics, and referred to as "ASTD values" herein) are delivered by the exposure tool.

Likewise, as indicated by the line designated 34, raw registration data and metrics of data quality associated with the measurement tool (called target diagnostics, and referred to as "TD values" herein) are delivered by the measurement tool. In Step 35, the raw data and the ASTD values and the TD values are analyzed using a computerized analysis program having desired parameters to yield a first set of correctables which takes into account inaccuracies associated with both the exposure tool and the measurement tool. The correctables obtained in Step 35 are incorporated in Step 36 into an advanced process control system ("APC System") to yield a final set of correctables for modifying operation of the exposure tool. The APC System utilizes the input information to make adjustments to the integrated circuit manufacturing process and in particular, to modify the operation of the exposure tool.

With continued reference to FIG. 3, examples of preferred methods for utilization of the TD values and the ASTD values are set forth below.

Example 1

The TD values and the ASTD values may preferably be applied to weight the measured registration values prior to computing the first set of correctables. Conventionally, correctables are computed by fitting model equations at each measured point based on the raw data corresponding to the measured registration errors $\Delta x$ and $\Delta y$ as a function of their positions x and y within a field and the X, Y position of the field on the substrate and all of the points $(\Delta x, \Delta y)$ are weighted equally. When only a limited number of points is measured, a few bad data points can lead to serious errors in the estimated correctables. In accordance with one aspect of the invention, weighting factors W(x,y) are determined for each point $(\Delta x, \Delta y)$ from the TD and ASTD values according to a predetermined equation. An example of a preferred Equation 1 for determining weighting factors based on the TD values and the ASTD values is:

$$\text{MIN}\left(\sum_{(x,y)} W(x, y) * ((\Delta x - (\text{model } \Delta x))^2 + (\Delta y - (\text{model } \Delta y))^2)\right)$$

where model $\Delta x = x0 + A1*x + A2*y +$ higher order terms, and similarly for $\Delta y$.

For example, if the TD values indicate relatively high confidence in the measurement while the ASTD values for the alignment indicated relatively low confidence, it is preferred to treat the measured registration data as correct and apply a high weighting value for that point. On the other hand, if the TD values for the measurement indicated relatively low confidence and the ASTD values for the alignment indicated relatively high confidence, it is preferred to treat the alignment as valid and the metrology measurement as not valid, and apply a very small weighting value to that point. A sliding scale may preferably be used to weight each point based on the relative strength of the TD and ASTD values for that point. Also, separate weighting values may be applied to the x and y portions of Equation 1 in situations wherein the x and y TD and ASTD values vary from each other by a significant amount.

Example 2

In accordance with another aspect of the invention, the TD and ASTD values are preferably utilized to weight the measured correctables in obtaining the final set of correctables, e.g., weighting the correctable value applied through the control loop of the APC System. In one embodiment, the correctables are preferably weighted based on the TD and ASTD values.

For example, if the ASTD values are determined to have relatively high confidence that the exposure tool aligned correctly, but the TD values indicate a lower confidence in the measurement, the weighting factor for that lot of substrates is preferably set to a relatively low value. On the other hand, if the TD values are determined to have relatively high confidence in the measurement while the ASTD indicates a lower confidence in the alignment quality, the weighting value is preferably set to a fairly high value. A preferred Equation 2 for determining a final set of correctables based on such weighting of the TD and ASTD values is as follows:

$$\text{Correctable(Lot } N) = \frac{\sum_{L=1}^{N} W_L * (\text{Computed correctables})_{LOT\ L}}{N}$$

The weighting factors are preferably normalized so that $$\sum_{L=1}^{N} W_L = N.$$

The correctables, improved as by the foregoing weighting methods described in Examples 1 and 2 are incorporated into the computations of Step 36 as indicated by reference numeral 37 of FIG. 3.

Figure 4:
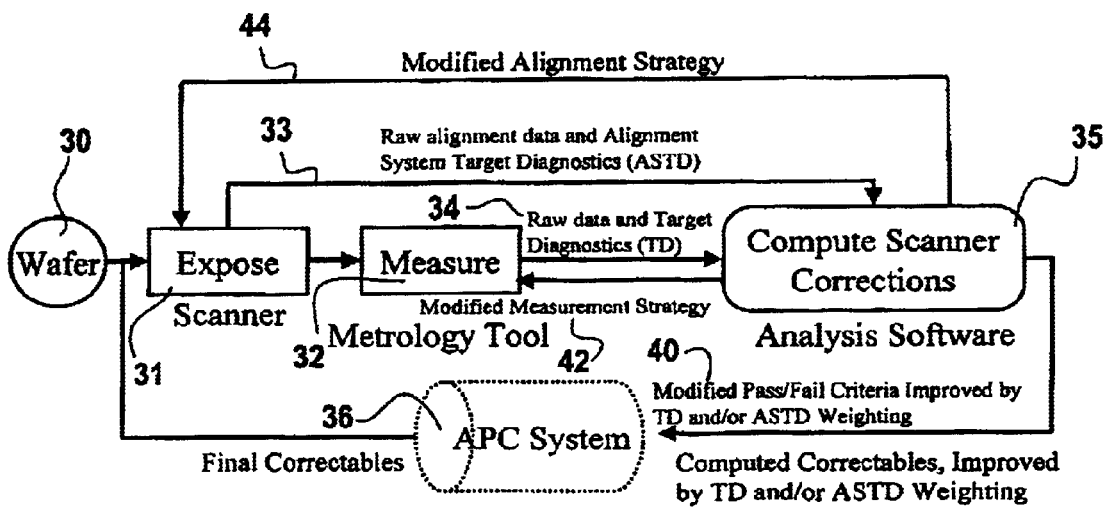
FIG. 4 is a flow chart for a feedback system for overlay control in accordance with a second preferred embodiment of the invention.

Turning now to FIG. 4, there is shown a functional block diagram showing steps of manufacture of an integrated circuit in accordance with additional preferred embodiments, as set forth in the following examples 3–5, for achieving improved correction of alignment inaccuracies by taking into account inaccuracies associated with both the exposure tool and the measurement tool.

Example 3

In accordance with yet another aspect of the invention, and as indicated by reference numeral 40 in FIG. 4, the metrics of measurement and alignment target quality are preferably utilized to modify the pass/fail limits for lots of substrates. Typically, users set a limit on overlay error, either a maximum measured or predicted value, or a 99.7% (3 sigma) value, above which the lot fails and must be put on hold for engineering, reworked, or scrapped. In accordance with the invention the TD and ASTD values may advantageously be used to modify these pass/fail limits. For example, if the TD and/or ASTD values indicate that the substrate was accurately aligned and that the substrate level overlay performance was accurately determined, then it may be determined to pass a lot even if the measured errors are relatively close to the limit value.

Conversely, if the TD and/or ASTD values indicate a low confidence in the accuracy of the alignment and measurement, then it is preferred to set a lower tolerance level on the overlay limits before putting a lot on hold. This utilization of the TD and ASTD values may accordingly improve productivity by reducing the number of lots on hold, the number of hours of engineering time needed to review suspect lots, and the amount of unnecessary reworks.

Example 4

In yet another aspect of the invention, and as indicated by reference numeral 42 in FIG. 4, the metrics of measurement and alignment target quality are utilized to modify the measurement sampling plan and collect more data as needed to attain a higher degree of confidence. In this case, if the ASTD values indicates low confidence in the quality of the alignment on the exposure tool, more data may be requested from the measurement tool, either equally distributed across the substrate or in specific areas of the substrate where the ASTD values are particularly low. After measurement, the TD values of the metrology measurements are preferably evaluated, and, if they are deemed too low, additional metrology measurements may preferably be performed, either globally or in specific locations. For example, if the average TD value are relatively high and indicate good confidence in the metrology, but one data point has a relatively low TD reading, more measurements may be requested in the neighborhood of the suspect mark. If the new readings have higher TD values, the suspect value may be rejected, resulting in more accurate data and computed correctables.

Alternatively, the sampling plan on the measurement tool as set forth in example 4 may be altered not just by changing the number of alignment marks to be measured, but also by changing the type of mark to be measured. In case of low TD values, alternate mark designs could be utilized to determine a better mark for the current measurement which produces a higher TD value and more confidence in the measurement results. The ASTD values may also be utilized as by developing statistics of previous measurement marks relative to the TD and/or ASTD values.

Example 5

In still another aspect of the invention, and as indicated by reference numeral 44 in FIG. 4, the metrics of measurement and alignment target quality may be used to modify the alignment strategy and align to more sites to obtain a higher degree of confidence. In this case, if the ASTD values indicate low confidence in the quality of the alignment on the exposure tool, more sites are preferably aligned prior to exposure to increase the confidence in the alignment. The additional sites may preferably be distributed globally across the substrate, or in specific sites where the ASTD values are particularly low. After the substrate is measured, the TD values may be analyzed to determine the degree of confidence of the measured registration values. If the TD values and the ASTD values are both relatively low, it is preferred to perform more alignments on future substrates, either globally or in specific areas.

The alignment plan on the exposure tool as set forth in example 5 may also be altered not just by changing the number of alignment marks to be used, but also by changing the type of mark. For example, in the case of low ASTD values, alternate mark designs may be selected and the results evaluated to determine a better mark for the current alignment which produces a higher ASTD value and more confidence in the alignment accuracy. The TD values may also be utilized as by developing statistics of previous measurement marks relative to the TD and/or ASTD values.

The methodologies of examples 1–5 are also applicable to manufacturing situations utilizing a combined registration/alignment mark, wherein a common mark is used for both alignment and measurement. In this case, if relatively low TD and ASTD values are observed for one mark while the values for most other marks on the substrate were significantly higher, it is preferred to treat the particular mark as damaged and to not utilize it in determining the correctables.

The foregoing methodologies may also be extended by inclusion of a database to correlate the TD and ASTD values to product yield. For example, the yield data may be analyzed and, in cases where it is determined that a TD or an ASTD value above a certain threshold provides a reliable predictor of device yield, then that threshold could be used in setting the weighting factors, or in setting the limits for altering the measurement and alignment plans or pass/fail limits.

Similarly, if it is observed that a combination of TD and ASTD values may be reliably used to predict device yields, then such values may be used to set the weighting factors based on the combination of measurement and alignment target diagnostics. If it is observed that the TD and/or ASTD values might not be critical below a certain measured registration error, i.e., as long as the measured errors are small, this may indicate that the process is relatively tolerant to variations in the target diagnostic values. Conversely, in some instances it may be determined that a threshold value may exist for the measured overlay error, above which the values of the TD and/or ASTD metrics begin to show a critical correlation to yield. In this case, it is preferred to modify the methodologies to set threshold limits not just on the target diagnostic values, but on the combination of the target diagnostic values and the measured overlay and/or alignment errors.

The inventive methods described herein provide numerous advantages relating to the manufacture of integrated circuits. The methods enable achievement of higher confidences in the accuracy of the substrate alignment on the exposure tool and the accuracy of the registration measurements on the measurement tool. The methods disclosed here help the user resolve discrepancies between the data provided by the alignment system and that provided by the measurement tool, and help determine what is the true overlay performance on the process wafers. This higher confidence and better determination of the true overlay performance enables more accurate calculation of exposure tool correctables, leading to tighter overlay control, leading to higher yield on the product wafers and enabling process shrinks to squeeze more good die onto each wafer, resulting in a significant reduction in cost per die.

The invention also achieves improved pass/fail decisions, which results in higher fabrication productivity, lower rework, fewer lot on hold, and reduced engineering costs. Also achieved are improved exposure tool alignment capability, which results in reduced rework, higher productivity, and higher yield.

The methods are described herein in the context of utilization of a computer system to compute the exposure tool correctables and make pass/fail decisions. In this regard, it will be understood that these computations may alternatively be performed on the measurement tool itself, or on the exposure tool itself, using simple data communication loops to link the exposure tool and the measurement tool so that one or the other can have access to all data from both tools. Alternatively, all data transfers could be mediated through a fabrication unit MES system using standardized protocols, such as SECS/GEM, HSMS, and .Net.

It will further be appreciated that the methods described herein for overlay control may also be applied to critical dimension control, using target diagnostics from the critical dimension measurement tool and/or exposure tool diagnostics of the focus, leveling and illumination systems.

The system as described herein is adaptable for use with any type of alignment system, and thus is not to be construed as limited to any specific type or configuration of alignment mark or alignment system. Similarly, the system described is not limited to any specific type of registration mark or measurement system. Rather, the system works in cooperation with an alignment system and a measurement system.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for controlling the operation of an exposure tool in the fabrication of an integrated circuit on a substrate, to control registration between a preceding layer of the integrated circuit and a succeeding layer of the integrated circuit, the method comprising the steps of:

forming the preceding layer, the preceding layer having an associated first alignment mark and an associated first registration mark, aligning the succeeding layer to the preceding layer using an exposure tool, the succeeding layer having an associated second alignment mark and an associated second registration mark, measuring and reporting with the exposure tool alignment information relating to relative positions of the first alignment mark associated with the preceding layer and the second alignment mark associated with the succeeding layer, performing additional process steps on the substrate, measuring and reporting with a measurement tool after the additional process steps registration information relating to relative positions of the first registration mark associated with the preceding layer and the second registration mark associated with the succeeding layer, analyzing the alignment information from the exposure tool and the registration information from the measurement tool to determine corrections to improve registration between the preceding layer and the succeeding layer, and altering the operation of the exposure tool based at least in part upon the determined corrections.

2. The method of claim 1, wherein the first alignment mark is also the first registration mark and the second alignment mark is also the second registration mark.

3. The method of claim 1, wherein the exposure tool is selected from a group consisting of scanners, steppers, step and scan systems, proximity printing systems, and contact printers.

4. The method of claim 1, wherein the measurement tool is selected from a group consisting of scanning electron microscopes, optical microscopes, non-imaging optical tools, tools using diffraction gratings to create a phase signal, and physical metrology profilometers.

5. The method of claim 1, wherein the alignment information includes raw measurement data.

6. The method of claim 1, wherein the alignment information includes both raw measurement data and data quality metrics.

7. The method of claim 1, wherein the alignment information includes both raw measurement data and data quality metrics, and the data quality metrics are selected from a group consisting of metrics of signal strength, metrics of signal symmetry, metrics of how well a signal reproduces an expected alignment mark, and analysis of the alignment marks to determine spatial frequencies and material composition of the alignment marks.

8. The method of claim 1, wherein the registration information includes raw measurement data.

9. The method of claim 1, wherein the registration information includes both raw measurement data and data quality metrics.

10. The method of claim 1, wherein the registration information includes both raw measurement data and data quality metrics, and the data quality metrics are selected from a group consisting of metrics of signal strength, metrics of signal symmetry, metrics of how well a signal reproduces an expected registration mark, and analysis of the registration marks to determine spatial frequencies and material composition of the registration marks.

11. The method of claim 1, wherein the alignment information includes both raw measurement data and data quality metrics and the registration information includes both raw measurement data and data quality metrics.

12. The method of claim 1, wherein the alignment information includes both raw measurement data and data quality metrics and the registration information includes both raw measurement data and data quality metrics, and the step of analyzing the alignment information and the registration information to determine corrections to improve registration between the preceding layer and the succeeding layer comprises comparing the data quality metrics from the alignment information with the data quality metrics from the registration information.

13. The method of claim 1, wherein the analysis includes a weighting of the alignment information relative to the registration information.

14. The method of claim 1, wherein the alignment information includes both raw measurement data and data quality metrics and the registration information includes both raw measurement data and data quality metrics, and the analysis includes a weighting of the raw measurement data of the alignment information relative to the raw measurement data of the registration information, where the weighting is based at least in part on a comparison of the data quality metrics of the alignment information and the data quality metrics of the registration information.

15. The method of claim 1, wherein the alignment information includes both raw measurement data and data quality metrics and the registration information includes both raw measurement data and data quality metrics, and the analysis includes a weighting of the raw measurement data of the alignment information relative to the raw measurement data of the registration information, where the weighting is based at least in part on the data quality metrics of the alignment information.

16. The method of claim 1, wherein the analysis includes a weighting of the determined corrections.

17. The method of claim 1, wherein the alignment information includes both raw measurement data and data quality metrics and the registration information includes both raw measurement data and data quality metrics, and the analysis includes a weighting of the determined corrections, where the weighting is based at least in part on a comparison of the data quality metrics of the alignment information and the data quality metrics of the registration information.

18. The method of claim 1, wherein the alignment information includes both raw measurement data and data quality metrics and the registration information includes both raw measurement data and data quality metrics, and the analysis includes a weighting of the determined corrections, where the weighting is based at least in part on the data quality metrics of the alignment information.

19. The method of claim 1, wherein the alignment information includes both raw measurement data and data quality metrics and the registration information includes both raw measurement data and data quality metrics, and the analysis includes a weighting of the determined corrections, where the weighting is based at least in part on the data quality metrics of the registration information.

20. The method of claim 1, wherein the analysis includes a modification of pass fail limits.

21. The method of claim 1, wherein the alignment information includes both raw measurement data and data quality metrics and the registration information includes both raw measurement data and data quality metrics, and the analysis includes a modification of pass fail limits, where the modification is based at least in part on a comparison of the data quality metrics of the alignment information and the data quality metrics of the registration information.

22. The method of claim 1, wherein the alignment information includes both raw measurement data and data quality metrics and the registration information includes both raw measurement data and data quality metrics, and the analysis includes a modification of pass fail limits, where the modification is based at least in part on the data quality metrics of the alignment information.

23. The method of claim 1, wherein the analysis includes a modification of an alignment strategy.

24. The method of claim 1, wherein the alignment information includes both raw measurement data and data quality metrics and the registration information includes both raw measurement data and data quality metrics, and the analysis includes a modification of an alignment strategy, where the modification is based at least in part on a comparison of the data quality metrics of the alignment information and the data quality metrics of the registration information.

25. The method of claim 1, wherein the alignment information includes both raw measurement data and data quality metrics and the registration information includes both raw measurement data and data quality metrics, and the analysis includes a modification of an alignment strategy, where the modification is based at least in part on the data quality metrics of the alignment information.

26. The method of claim 1, wherein the alignment information includes both raw measurement data and data quality metrics and the registration information includes both raw measurement data and data quality metrics, and the analysis includes a modification of an alignment strategy, where the modification is based at least in part on the data quality metrics of the registration information.

27. The method of claim 1, wherein the analysis includes a modification of at least one of a number and type of alignment positions.

28. The method of claim 1, wherein the alignment information includes both raw measurement data and data quality metrics and the registration information includes both raw measurement data and data quality metrics, and the analysis includes a modification of at least one of a number and type of alignment positions, where the modification is based at least in part on a comparison of the data quality metrics of the alignment information and the data quality metrics of the registration information.

29. The method of claim 1, wherein the alignment information includes both raw measurement data and data quality metrics and the registration information includes both raw measurement data and data quality metrics, and the analysis includes a modification of at least one of a number and type of alignment positions, where the modification is based at least in part on the data quality metrics of the alignment information.

30. The method of claim 1, wherein the alignment information includes both raw measurement data and data quality metrics and the registration information includes both raw measurement data and data quality metrics, and the analysis includes a modification of at least one of a number and type of alignment positions, where the modification is based at least in part on the data quality metrics of the registration information.

31. The method of claim 1, wherein the alignment information includes both raw measurement data and data quality metrics and the registration information includes both raw measurement data and data quality metrics, and the analysis includes correlating both the data quality metrics of the alignment information and the data quality metrics of the registration information to integrated circuit yield.

* * * * *